United States Patent [19]

Yanase

[11] Patent Number: 4,625,297

[45] Date of Patent: Nov. 25, 1986

[54] MAGNETIC-BUBBLE MEMORY DEVICE

[75] Inventor: Takeyasu Yanase, Yokohama, Japan

[73] Assignee: Fujitsu Limited, Kawasaki, Japan

[21] Appl. No.: 513,657

[22] Filed: Jul. 14, 1983

[30] Foreign Application Priority Data

Jul. 17, 1982 [JP] Japan ................. 57-123767

[51] Int. Cl.⁴ .............................................. G11C 19/08
[52] U.S. Cl. ...................................................... 365/39
[58] Field of Search ................................... 365/39, 43

[56] References Cited

U.S. PATENT DOCUMENTS 4,355,373 10/1982 Bobeck ................................. 365/39
4,357,682 11/1982 Shapiro ................................. 365/39
4,486,858 12/1984 Yanase et al. ......................... 365/39

Primary Examiner—James W. Moffitt
Attorney, Agent, or Firm—Staas & Halsey

[57] ABSTRACT

A magnetic-bubble memory device having a bubble propagation track, defined by patterns of magnetically soft material, along which magnetic bubbles propagate in response to an in-plane rotating magnetic drive field. The bubble propagation track has a first track and a second track interconnected by a turn and defined by known hook-shaped wide-gap patterns or by modified wide-gap patterns. The turn includes a crooked bar-shaped pattern. An end portion of the last pattern of the first track is positioned opposite the inner edge of the crooked bar-shaped pattern, and an end portion of the crooked bar-shaped pattern is positioned adjacent to the first pattern of the second track. Such a bubble propagation track makes it possible to realize a 4 μm period, 4 Mb bubble memory.

13 Claims, 27 Drawing Figures

Fig. 12    Fig. 13    Fig. 14
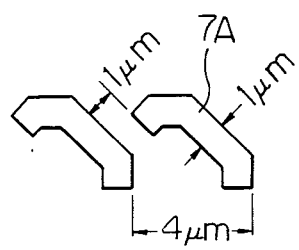
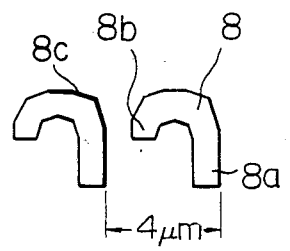
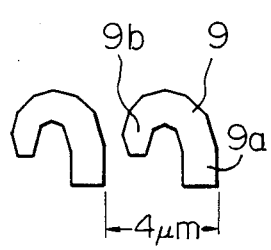
Fig. 15
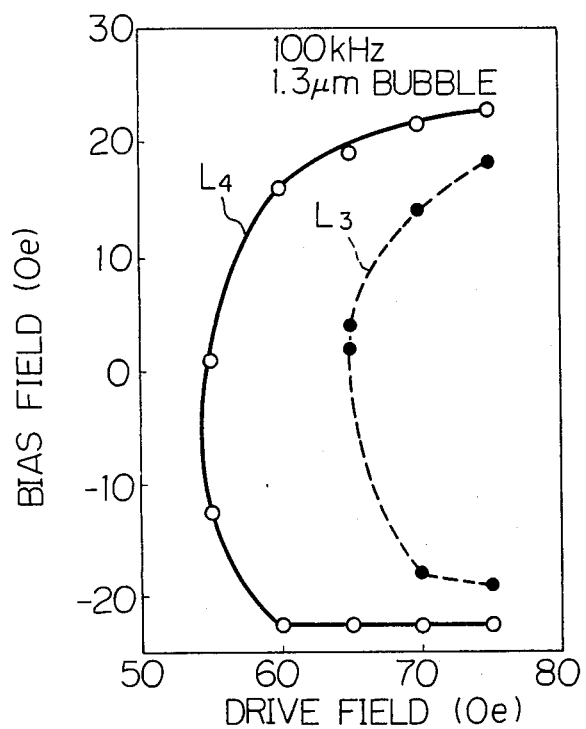

MAGNETIC-BUBBLE MEMORY DEVICE

BACKGROUND OF THE INVENTION

This application is related to two U.S. applications having Ser. No. 505,978 filed June 20, 1983 and now U.S. Pat. No. 4,561,069 and Ser. No. 513,610 filed July 14, 1983, and now U.S. Pat. No. 4,486,858 which are assigned to the Assignee of the present application.

1. Field of the Invention

The present invention relates to a magnetic-bubble memory device (hereinafter referred to as a bubble memory) and more particularly to a bubble propagation track defined by elements or patterns of magnetically soft material.

2. Description of the Prior Art

There are various known types of bubble memories, the most common one being an in-plane field access type of bubble memory which includes a thin layer of magnetic material in which magnetic bubbles can be propagated along propagation tracks in response to a magnetic drive field rotating or reorienting cyclically in the plane of the magnetic material layer. An in-plane field access type of bubble memory in which the bit period is 8 micrometers ($\mu$m) and the capacity is 1 megabit (Mb) has been realized, and a 4 $\mu$m period, 4 Mb bubble memory is now being developed.

There are two well-known types of propagation tracks, one being defined by elements or patterns of magnetically soft material such as permalloy and commonly called a "permalloy propagation track" and the other being defined by an ion-implanted pattern and commonly called an "ion-implanted propagation track". A 4 $\mu$m period ion-implanted track can be easily fabricated and is a very effective means for realizing a 4 $\mu$m period, 4 Mb bubble memory. However, superior-performance function gates for a 4 Mb bubble memory having a 4 $\mu$m period ion-implanted track, particularly block-replicate gates for major-minor loop-organized bubble memories, are still in the process of development.

Superior-performance function gates for a bubble memory with a permalloy track have already been realized. However, in realizing a 4 $\mu$m period permalloy track, there is a gap problem. There are known gap-tolerant permalloy propagation patterns, such as half-disk and asymmetric chevron patterns. However, an allowable gap for a gap-tolerant pattern is, at the most, one eighth of the period. Therefore, in a 4 $\mu$m period permalloy track defined by gap-tolerant patterns, the gaps should have a width of 0.5 $\mu$m or less, which cannot be achieved by present-day photolithographic resolution.

New permalloy propagation patterns, called wide-gap patterns, have been reported by A. H. Bobeck et al (EA-1, 3M conference, Atlanta, 1981). In a wide-gap track defined by wide-gap patterns (explained in detail with reference to the accompanying drawings), superior bubble propagation performance can be obtained with gaps one fourth of the period. Therefore, a wide-gap pattern is a very promising means for realizing a 4 $\mu$m period using a 1 $\mu$m gap permalloy bubble propagation track which can be fabricated by present-day photolithography, thus realizing a 4 $\mu$m period, 4 Mb bubble memory.

In the design of bubble propagation tracks, 90° and 180° turns are important. In particular, for a folded a doubled-back minor loop in a major-minor loop-organized bubble memory, 180° turns are indispensable. Several turn designs for the wide-gap permalloy propagation track mentioned above have been reported by A. H. Bobeck et al. However, as explained below, poor propagation performance is observed for the reported wide-gap track turns.

SUMMARY OF THE INVENTION

It is an object of the present invention to provide a wide-gap permalloy bubble propagation track of a magnetic-bubble memory device in which the propagation performance at a turn is superior.

Another object of the present invention is to provide a 4 $\mu$m period, 4 Mb bubble memory having a wide-gap permalloy propagation track.

According to the present invention, there is provided a magnetic-bubble memory device which includes a magnetic layer in which magnetic bubbles can be moved and bubble propagation tracks along which the bubbles in the magnetic layer can be propagated in response to a magnetic drive field rotating in the plane of the magnetic layer. The propagation tracks include at least one loop which has a first track and a second track extending in different bubble propagation directions and a turn interconnecting the first track and the second track. The first track and the second track are defined by a plurality of hook-shaped propagation patterns of magnetically soft material. The patterns have a first end portion and a second end portion and are arranged in the direction of bubble propagation so that the second end portion of a preceding pattern is not parallel to the first end portion of the succeeding pattern. The second end portion of the preceding portion is separated from the first end portion of the succeeding patern and is located opposite the outer edge of the succeeding pattern. The turn includes a crooked bar-shaped pattern of magnetically soft material. The second last portion of the end pattern of the first track is positioned opposite the inner edge of the crooked bar-shaped pattern, with a gap therebetween. An end portion of the crooked bar-shaped pattern is located adjacent to the first pattern of the second track, with a gap therebetween. The bubbles propagate from the last pattern of the first track, via the crooked bar-shaped pattern, to the first pattern of the second track.

In an embodiment of the present invention, the turn is a 180° turn which also includes an auxiliary pattern disposed in a region adjacent to the outer edge of the crooked bar-shaped pattern. The auxiliary pattern has an end portion disposed adjacent to the end of the crooked bar-shaped pattern and to the first pattern of the second track.

The present invention is now described in detail based on the preferred embodiments and in contrast with the prior art, with reference to the accompanying drawings.

BRIEF DESCRIPTION OF THE DRAWINGS

FIGS. 3, 4, and 5 illustrate various conventional permalloy bubble propagation tracks;

FIGS. 12, 13, and 14 illustrate various 4 μm period wide-gap tracks designed by the inventors of the present invention based on known wide-gap patterns;

FIG. 15 is a graph showing the propagation characteristics of the tracks illustrated in FIGS. 13 and 14;

DESCRIPTION OF THE PREFERRED EMBODIMENTS

Figure 1:
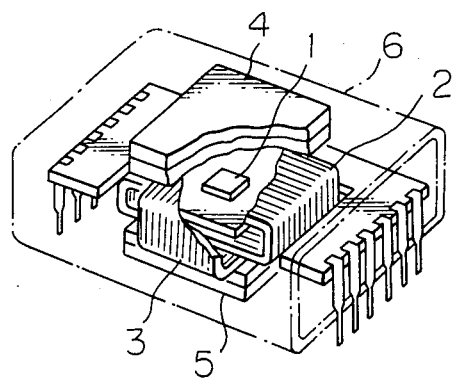
FIG. 1 is a partially broken perspective view of a conventional magnetic-bubble memory device illustrating the general construction thereof.

First, the prior art is described with reference to FIGS. 1 through 11. In FIG. 1, the bubble memory basically comprises a memory chip 1, two coils 2 and 3 disposed perpendicular to each other for generating an in-plane rotating magnetic field which drives the magnetic bubbles in the chip, permanent magnets 4 and 5 for generating a bias magnetic field which maintains the bubbles, and a shield case 6 (illustrated by the phantom line).

Figure 2:
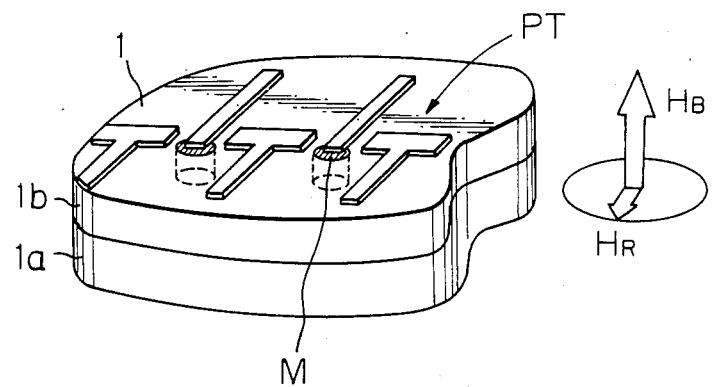
FIG. 2 is a diagrammatical perspective view of part of a conventional magnetic-bubble memory chip.

In FIG. 2, the memory chip 1 comprises a substrate 1a of, for example, gadolinium-gallium-garnet on which a layer 1b of magnetic material, such as magnetic garnet, is formed. On the magnetic layer 1b, bubble propagation tracks PT, defined by bubble propagation patterns of magnetically soft material such as permalloy, are formed. The track PT illustrated in FIG. 2 is defined by well-known T- and bar-shaped patterns.

Figure 4:
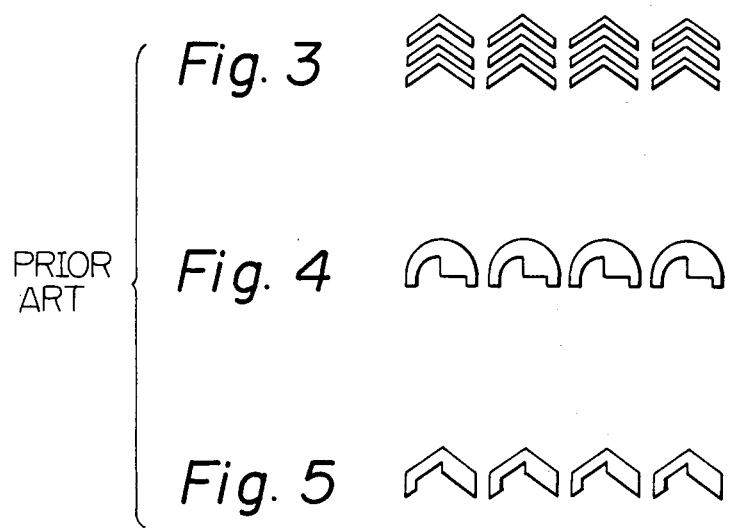

FIGS. 3, 4, and 5 illustrate various tracks defined by well-known chevron, half-disk, and asymmetric chevron patterns, respectively. The half-disk and asymmetric chevron patterns are gap-tolerant patterns.

Figures 6, 7:
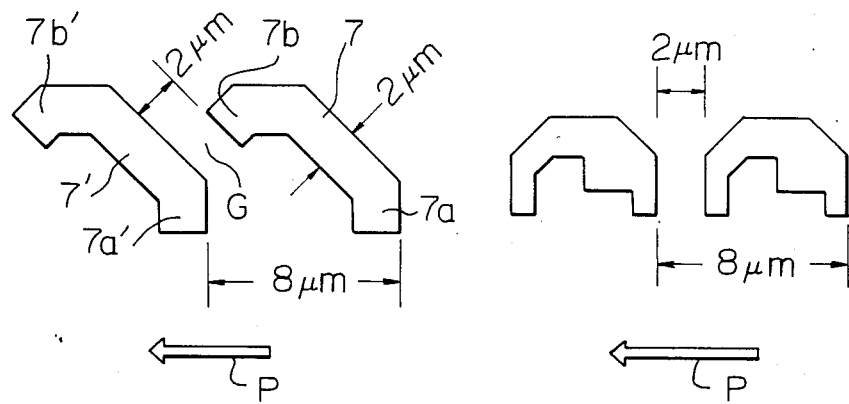
FIGS. 6 and 7 illustrate 8 $\mu$m period, 2 $\mu$m gap propagation tracks defined by known wide-gap patterns and conventional half-disk patterns, respectively.
Figure 8:
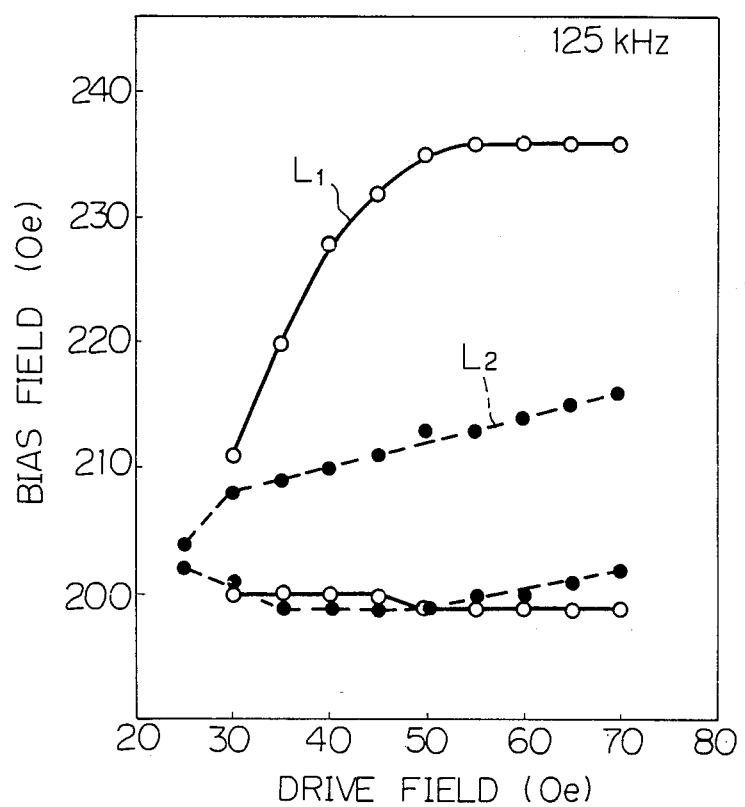
FIG. 8 is a graph showing the propagation characteristics of the tracks illustrated in FIGS. 6 and 7.

FIG. 6 illustrates an 8 μm period, 2 μm gap wide-gap track defined by one of several kinds of wide-gap patterns reported by A. H. Bobeck et al. The wide-gap pattern, designated by reference numeral 7 (7'), is a hook-shaped or clubfoot-shaped pattern and has a first end portion (a leg) 7a (7a') ad a second end portion (an arm) 7b (7b'). The wide-gap track is defined by the hook-shaped patterns 7 (7') which are arranged in the bubble propagation direction P in such a manner that the arm 7b of the preceding pattern 7 is not parallel to the leg 7a' of the succeeding pattern 7' and is positioned back from the leg 7a' with respect to the propagation direction P and opposite the outer edge of the succeeding pattern 7', with a gap G therebetween.

FIG. 7 illustrates an 8 μm period, 2 μm gap track defined by conventional half-disk patterns. The adjacent end portions of the half-disk patterns are parallel to each other and are on the same level at the ends thereof with respect to the propagation direction P.

The propagation characteristics of the wide-gap track and the half-disk track described above are as illustrated in FIG. 8 by the curves $L_1$ and $L_2$, respectively, under the conditions of a bubble diameter of 1.9 μm and a drive frequency of 125 kHz. As can be seen, a large bias margin and a required low drive field are obtained in the wide-gap track while a poor bias margin is obtained in the half-disk track.

Figure 9:
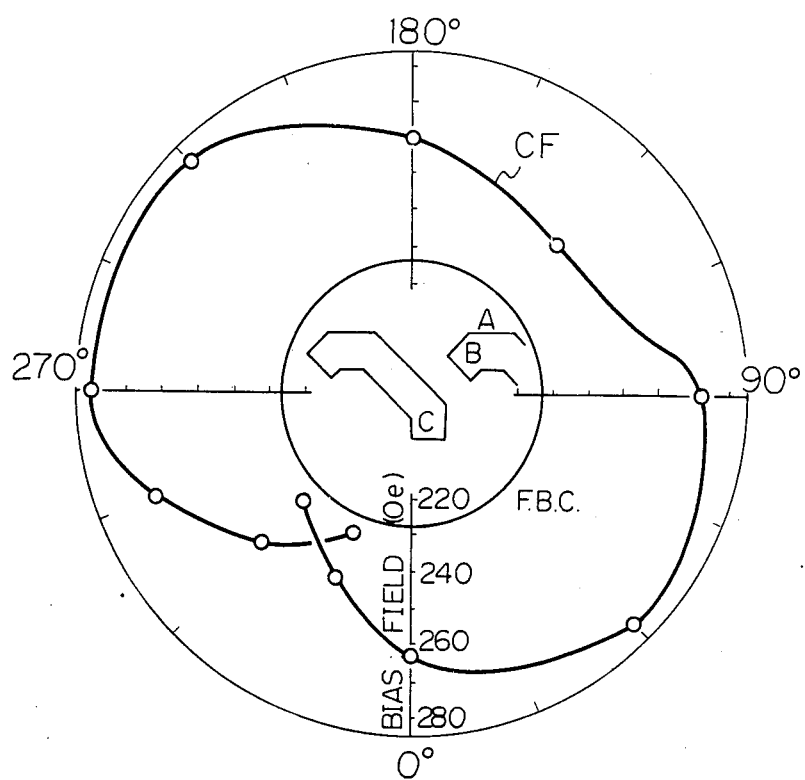
FIGS. 9 and 10 illustrate the magnetic characteristics of a wide-gap track.

The large gap tolerance of the wide-gap track mentioned above is explained with reference to FIGS. 9, 10, and 11. FIG. 9 illustrates the magnetic potential well depths of the 8 μm period, 2 μm gap wide-gap track illustrated in FIG. 6, which depths are measured by observing the real bubble motion in a quasi-static operation. The curve CF shows bubble collapse fields at each phase of a 58 Oe rotating drive field. The collapse field at point B of the pattern, as is shown in the figure, gradually decreases as the drive field is rotated to 337.5° while the collapse field at point C of the next pattern has already become higher than the free-bubble collapse field (FBC) at 315° and gradually increases with further drive field rotation. After a phase of 337.5°, the collapse field at point C becomes much higher than that at point B, and the collapse field at point B assumes the same value as that of the free bubble, which means that point B becomes magnetically neutral. Consequently, a sufficient potential gradient to propagate a bubble across the gap can be supplied by repulsive magnetic poles at point A, a neutral pole at point B, and attractive poles at point C.

Figure 10:
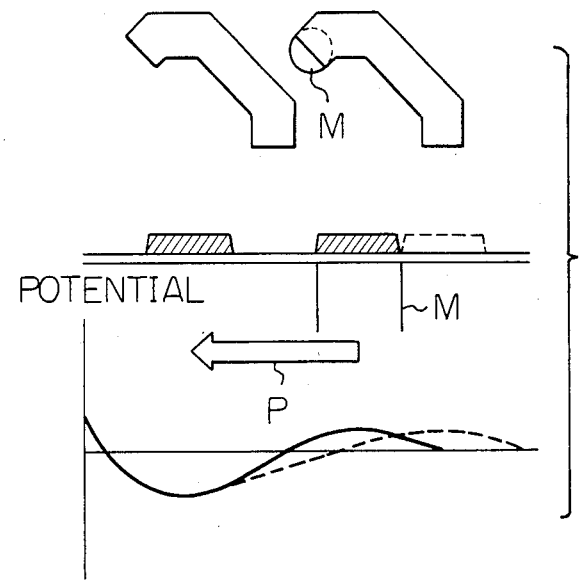
Figure 11:
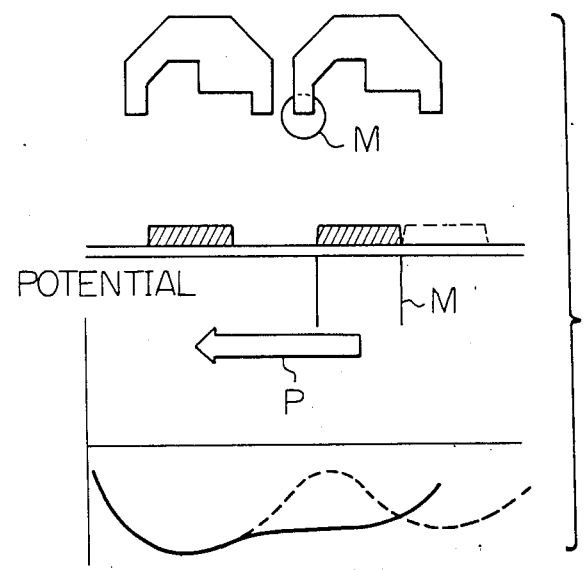
FIG. 11 illustrates the magnetic characteristics of a conventional permalloy track.

The superior gap tolerance of the wide-gap track is explained with reference to FIGS. 10 and 11, which illustrate the potential gradient across the pattern gap for the wide-gap track and the half-disk track, respectively. In the conventional half-disk track, deep and wide potential wells around the gap are deformed, presumably by a potential barrier created by widening the gap, as is shown by the broken line in FIG. 11. This potential barrier would prevent most bubbles from stretching and propagating across the gap; only large-diameter bubbles, that is, bubbles of a low bias-field range, could get across it. However, in the wide-gap track, the above-mentioned magnetic pole formation is supposed to yield a smooth potential gradient when the gap is increased, as is shown in FIG. 10. Therefore, it is assumed that a design objective for a 4 μm period wide-gap track is to make the potential gradient between the elements as steep and smooth as possible by utilizing attractive, neutral, and repulsive magnetic poles. By following this design rule, many variations in the 4 μm period wide-gap track have been constructed and tested.

FIGS. 12–14, illustrate 4 μm period wide-gap tracks. FIG. 12 illustrates a 4 μm period wide-gap track scaled down from the known 8 μm period wide-gap track shown in FIG. 6. FIGS. 13 and 14 illustrate 4 μm period wide-gap tracks defined by modified wide-gap patterns designed by the inventors of the present invention. In the pattern 8 illustrated in FIG. 13, the leg 8a is longer and the arm 8b is slightly longer than the leg and arm of the pattern 7A illustrated in FIG. 12. The second end portion (arm) 8b of a preceeding pattern is positioned opposite the outer edge 8c of the succeeding pattern. In the pattern 9 illustrated in FIG. 14, the leg 9a is wider and the arm including trapezoidal extension 9b is slightly longer than the leg and arm of the pattern 8 illustrated in FIG. 13. The propagation characteristics of the tracks illustrated in FIGS. 13 and 14 are illustrated in FIG. 15 by the curves $L_3$ and $L_4$, respectively, under the conditions of a bubble diameter of 1.3 μm and a drive frequency of 100 kHz. These characteristics are superior to those of the track illustrated in FIG. 12.

Figure 16:
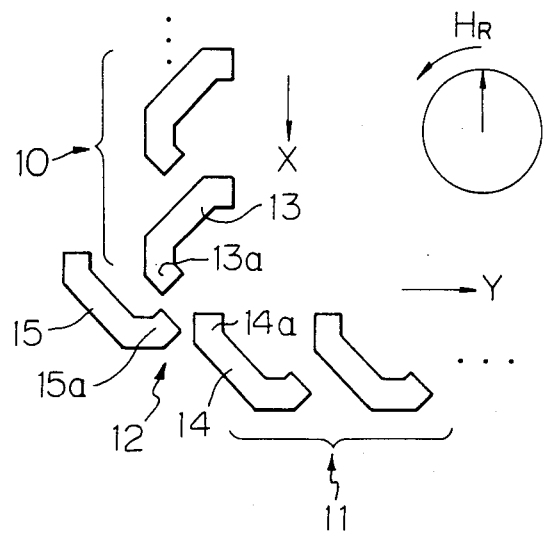
FIG. 16 illustrates a 90° turn of a known wide-gap track.

FIG. 16 illustrates a 90° turn of a 8 μm period wide-gap permalloy track reported by A. H. Bobeck et al. In the figure, reference numerals 10 and 11 designate first and second straight tracks for bubble propagation in the directions X and Y, respectively. The tracks 10 and 11 are the same as those illustrated in FIG. 6. A turn 12 which interconnects the first and second tracks 10 and 11 includes a hook-shaped permalloy pattern 15, which has the same configuration as the propagation patterns of the tracks 10 and 11. The pattern 15 has an end portion (an arm) 15a positioned adjacent to the end portions (arm and leg) 13a and 14a of the patterns 13 and 14 at the end of tracks 10 and 11, respectively. In this prior art turn, however, a steep and smooth magnetic potential gradient between the patterns 13 and 15 and between the patterns 15 and 14 cannot be obtained, and, accordingly, the propagation characteristics are poor, as is illustrated in FIG. 18 by the curve $L_5$.

Figure 17:
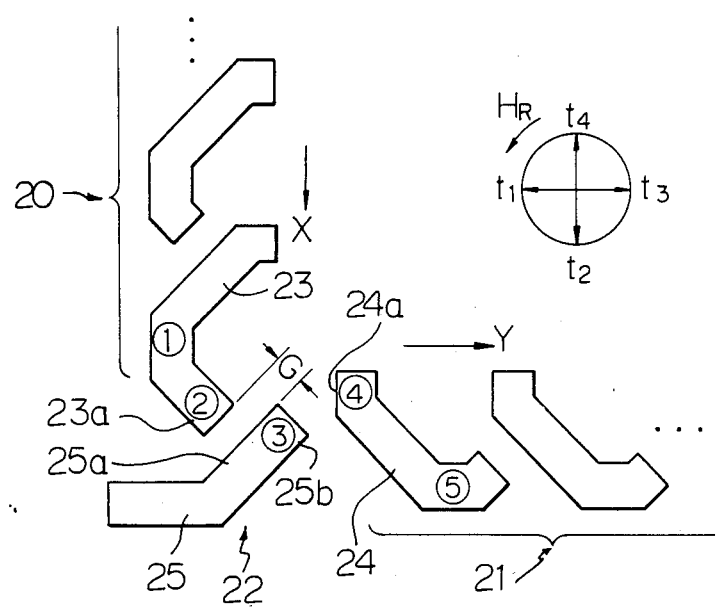
FIG. 17 illustrates an embodiment of the 90° turn of the wide-gap track according to the present invention.

FIG. 17 illustrates an embodiment of the 90° turn of the 8 μm period wide-gap permalloy propagation track according to the present invention. In the figure, reference numerals 20 and 21 designate first and second tracks which are substantially the same as the tracks 10 and 11, respectively, illustrated in FIG. 16. A turn 22 interconnecting the tracks 20 and 21 includes a crooked bar-shaped permalloy pattern 25 disposed between the terminal patterns of the first and second tracks 20 and 21, i.e., the last pattern 23 of the first track 20 and the first pattern 24 of the second track 21. The arm 23a of the end pattern 23 is positioned opposite the inner edge 25a of the pattern 25, with a gap G therebetween. The exit end portion 25b of the pattern 25 is positioned adjacent to the first end portion (leg) 24a of the first pattern 24, with a gap therebetween. It should be noted that it is desirable that the arm 23a of the pattern 23 is substantially perpendicular to the inner edge 25a of the pattern 25.

Bubble propagation in the track illustrated in FIG. 17 will now be described. In response to the rotation of the drive field $H_R$, a bubble moves along the first track 20 in the direction X to the last pattern 23 and is at the position "1" at phase $t_1$ of the drive field $H_R$. The successive rotation of the drive field $H_R$ causes the bubble to move successively into the position "2" of the arm 23a of the pattern 23 between phases $t_1$ and $t_2$, into the position "3" of the end portion 25b of the pattern 25 between phases $t_2$ and $t_3$, and into the position "4" of the leg 24a of the first pattern 24 of the second track 21 between phases $t_3$ and $t_4$. Further successive rotation of the drive field $H_R$ causes the bubble to move, via the position "5", along the second track 21 in the direction Y.

Figure 18:
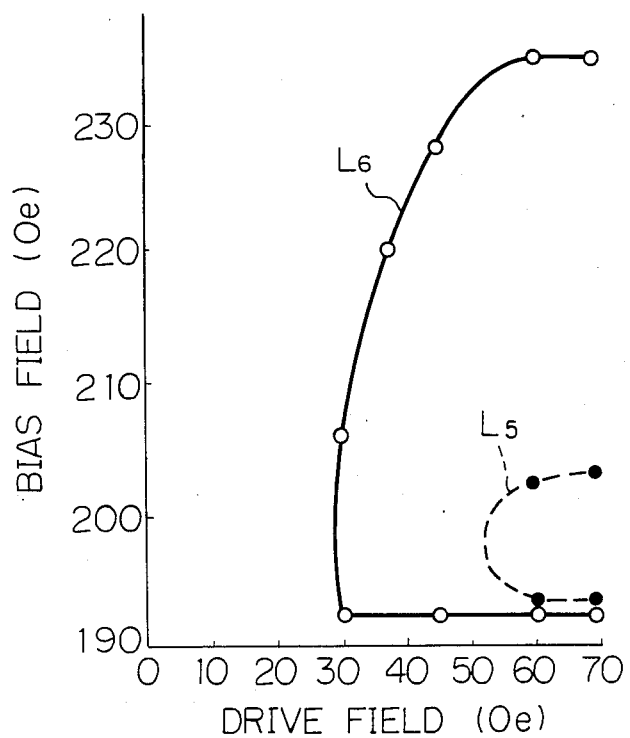
FIG. 18 is a graph showing the propagation characteristics of the tracks illustrated in FIGS. 16 and 17.

In the track of the present invention described above, a steep and smooth magnetic potential gradient between the patterns 23 ad 25 and between the patterns 25 and 24 can be realized, and, accordingly, superior propagation characteristics as illustrated in FIG. 18 by the curve $L_6$ can be obtained.

Figure 19:
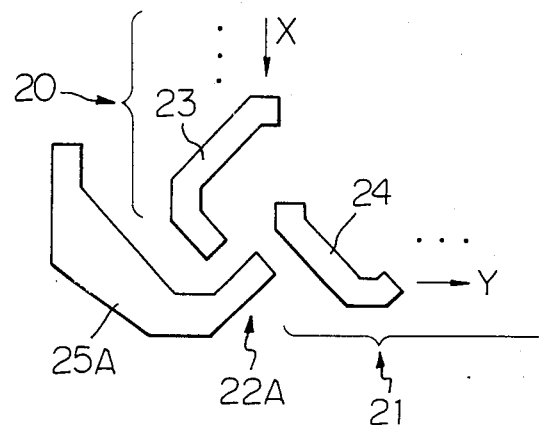
FIG. 19 illustrates another embodiment of the 90° turn of the wide-gap track according to the present invention.

FIG. 19 illustrates another embodiment of the 90° turn of the 8 μm period wide-gap track according to the present invention. This embodiment is basically the same as that illustrated in FIG. 17 except that the pattern 25A in the turn 22A has a different configuration than does the pattern 25 in the turn 22 of FIG. 17. The propagation characteristics of this embodiment are equal to or superior to those of the embodiment illustrated in FIG. 17.

Figure 20:
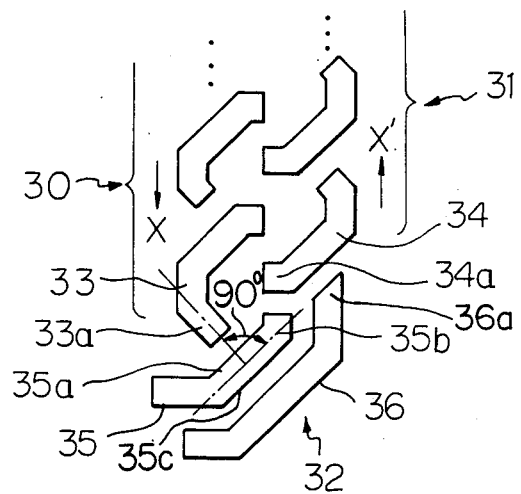
FIG. 20 illustrates an embodiment of the 180° turn of the wide-gap track according to the present invention.

FIG. 20 illustrates an embodiment of the 180° turn of the 8 μm period wide-gap permalloy track according to the present invention. In FIG. 20, reference numerals 30 and 31 designate first and second tracks which are the same as the tracks 20 and 21, respectively, illustrated in FIG. 17 except that bubble propagation is in the directions X and X'. A turn 32 interconnecting the tracks 30 and 31 includes a first, or main, crooked bar-shaped permalloy pattern 35 and a second, or auxiliary, crooked bar-shaped permalloy pattern 36. The arm 33a of the last pattern 33 of the first track 30 is positioned opposite the inner edge 35a of the main crooked bar-shaped pattern 35, with a gap therebetween. The end portion 35b of the main pattern 35 is adjacent to the leg 34a of the first pattern 34 of the second track 31. The auxiliary pattern 36 is disposed in a region adjacent to the outer edge 35c of the main pattern 35 so as to extend substantially parallel to the latter and has an exit end portion 36a adjacent to the end portion 35b of the main pattern 35 and to the first pattern 34 of the second track 31.

Figure 21:
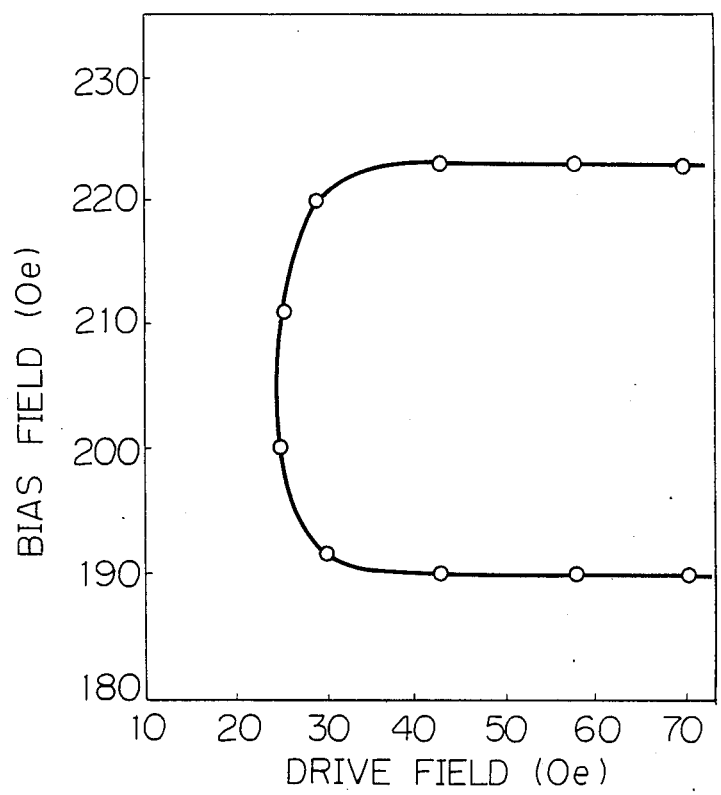
FIG. 21 is a graph showing the propagation characteristics of the track illustrated in FIG. 20.

In the track described above, a bubble propagates along the first track 30 in the direction X and, from the pattern 33, via the pattern 35, to the pattern 34, and further along the second track 31 in the direction X'. A steep and smooth magnetic potential gradient between the patterns 33 and 35 and the patterns 35 and 34 is realized, and, accordingly, the superior propagation characteristics illustrated in FIG. 21 can be obtained. It should be noted that the auxiliary pattern 36 contributes to realization of the steep and smooth magnetic potential gradient between the patterns 35 and 34.

Figure 22:
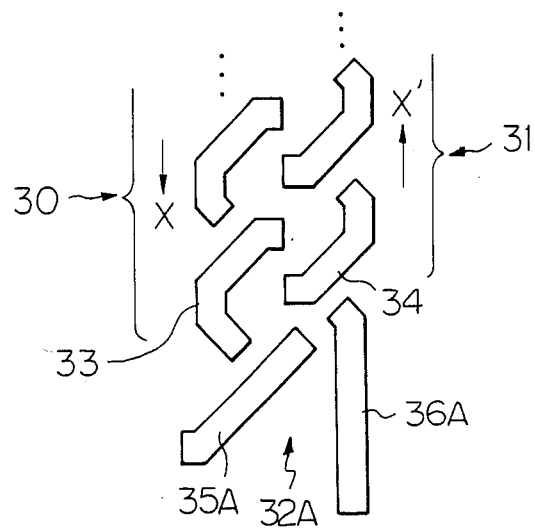
FIGS. 22, 23, 24, and 25 illustrate embodiments of the 180° turn of the wide-gap track according to the present invention.
Figure 23:
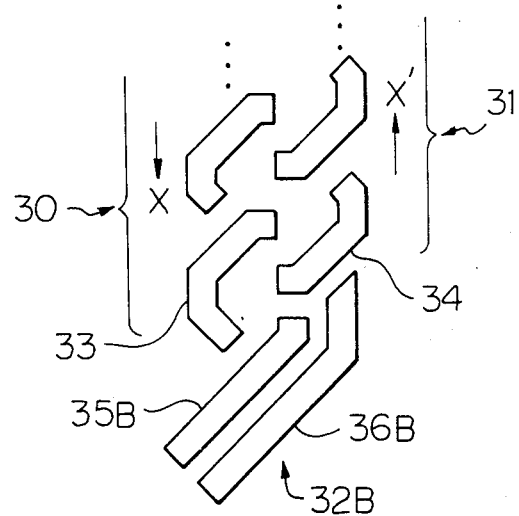

FIGS. 22 and 23 illustrate further embodiments of the 180° turn of the 8 μm period wide-gap permalloy propagation track according to the present invention. These embodiments are basically the same as the embodiment illustrated in FIG. 20 except for the configurations of the main patterns 35A and 35B and the auxiliary patterns 36A and 36B of the turns 32A and 32B in FIGS. 22 and 23, respectively. The propagation characteristics of these tracks are equal to or superior to those of the embodiment illustrated in FIG. 20.

Figure 24:
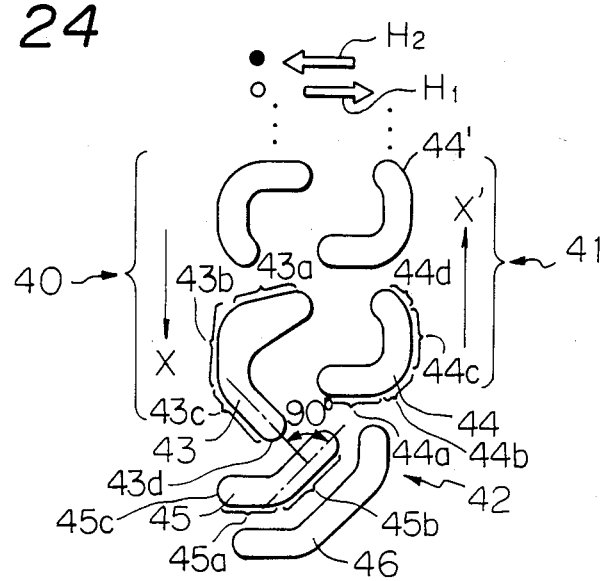
Figure 25:
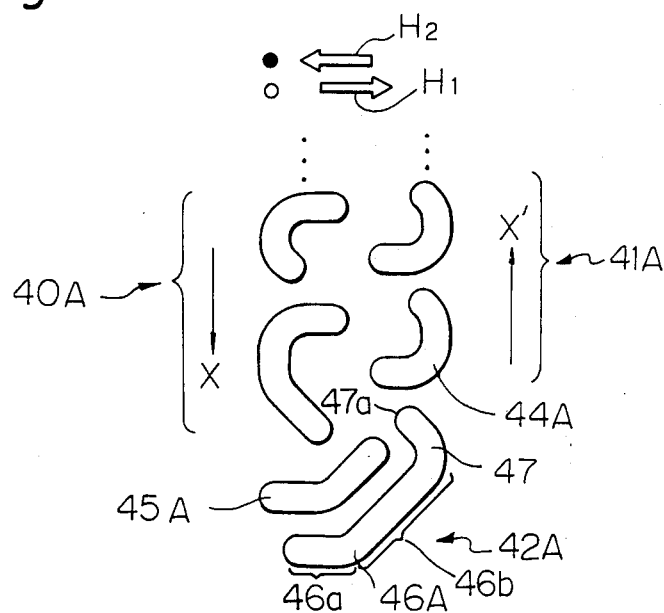

FIGS. 24 and 25 illustrate embodiments of the 180° turn of the 4 μm period wide-gap permalloy track according to the present invention. In FIG. 24, reference numerals 40 and 41 designate first and second straight tracks for bubble propagation in the directions X and X', respectively. The tracks 40 and 41 are defined by propagation patterns similar to the modified and improved wide-gap pattern illustrated in FIG. 13. A turn 42 includes a main crooked bar-shaped pattern 45 and an auxiliary crooked bar-shaped pattern 46. The positional relationship between the first and second terminal patterns 43 and 44 of the tracks 40 and 41, respectively, and the patterns 45 and 46 of the turn 42 is the same as that in the embodiment illustrated in FIG. 20, only the width of the gaps and the size and shape of the patterns are different. For example, the first terminal pattern 43 has a first end portion 43a, a mid-portion 43b and a second end portion 43c with a tip 43d and a center line. Similarly, the second terminal pattern 44 includes a first end portion 44a connected via a curve 44b to a mid-portion 44c and a second end portion 44d. The pattern 44 is thus a preceeding pattern for succeeding pattern 44'. The main crooked bar-shaped pattern 45 has first and second arms 45a and 45b with tips 45c and 45d.

The embodiment illustrated in FIG. 25 is basically the same as the embodiment illustrated in FIG. 24 except for the configuration of the patterns in the tracks 40A and 41A and the turn 42A. In particular, the auxiliary pattern 46A of the turn 42A has an end portion 47 which has a configuration considerably different from the end portion of the auxiliary pattern 46 illustrated in FIG. 24. The auxiliary pattern 46A also includes a first arm 46a, mid-portion 46b and tip 47a on the second arm 47.

Figure 26:
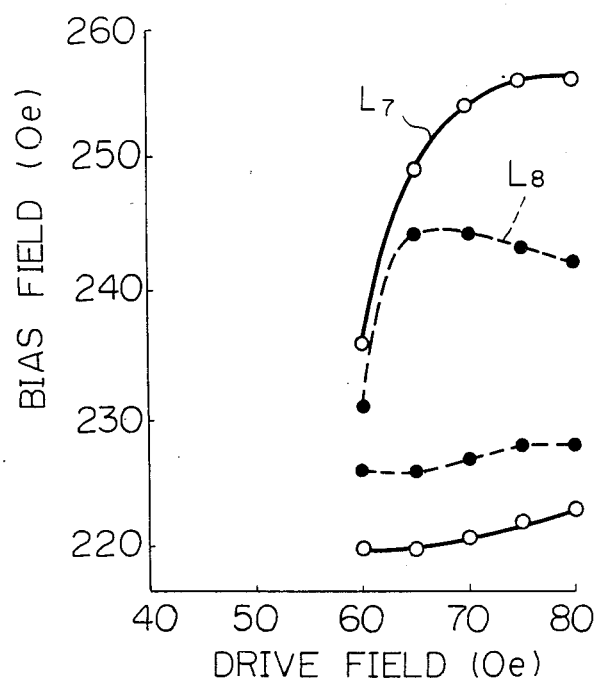
FIGS. 26 and 27 are graphs showing the propagation characteristics of the tracks illustrated in FIGS. 24 and 25, respectively.
Figure 27:
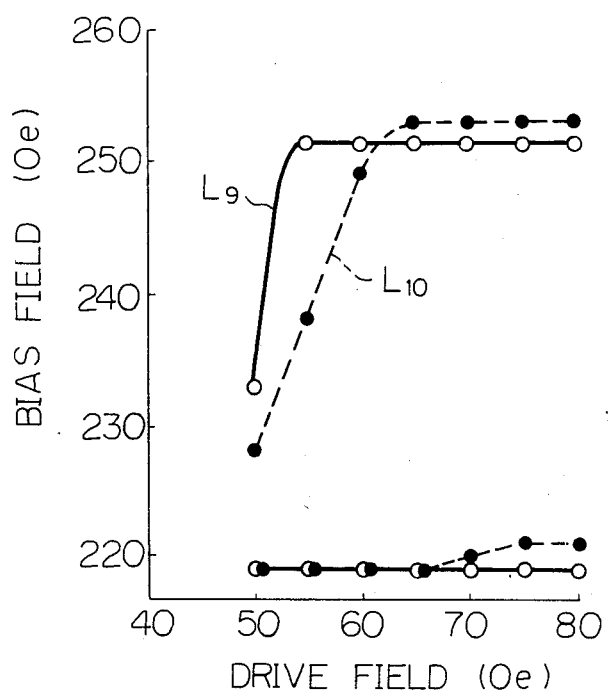

The propagation characteristics of the tracks illustrated in FIGS. 24 and 25 are illustrated in FIGS. 26 and 27, respectively, assuming that a 5 Oe in-plane holding field $H_1$ or $H_2$ is applied to the tracks as illustrated in FIGS. 24 and 25. The curves $L_7$ and $L_9$ represent the cases in which the field $H_1$ is applied, and the curves $L_8$ and $L_{10}$ represent the cases in which the field $H_2$ is applied.

As is obvious from the foregoing description, the present invention makes it possible to realize a 4 $\mu$m period permalloy bubble propagation track in which, particularly in the turn, superior propagation characteristics are obtained, and, accordingly, a 4 $\mu$m period, 4 Mb bubble memory can be obtained.

I claim:

1. A magnetic-bubble memory device in which magnetic bubbles are driven by a magnetic drive field, comprising:
    a magnetic layer in which the magnetic bubbles can be propagated; and
    a bubble propagation path along which the bubbles in said magnetic layer can be propagated in response to the magnetic drive field rotating in the plane of said magnetic layer, said bubble propagation path comprising:
        first and second tracks, extending in different bubble propagation directions, comprising hook-shaped propagation patterns of magnetically soft material, including first and last patterns in each of said first and second tracks, each of the hook-shaped propagation patterns having a first end portion, a second end portion and an outer edge, said hook-shaped propagation patterns arranged in the bubble propagation directions with the second end portion of a preceding pattern not parallel to the first end portion of the succeeding pattern and the second end portion of the preceding pattern disposed opposite and separated from the outer edge of the succeeding pattern; and
        a turn, interconnecting the first and second tracks, comprising a crooked bar-shaped pattern of magnetically soft material having an exit end portion with an inner edge, the second end portion of the last pattern in said first track disposed opposite and separated from the inner edge of the exit end portion of said crooked bar-shaped pattern, the exit end portion of said crooked bar-shaped pattern disposed adjacent to and separated from the first end portion of the first pattern in said second track, whereby the magnetic bubbles propagate from the last pattern in said first track, via said crooked bar-shaped pattern, to the first pattern in said second track.

2. A magnetic-bubble memory device according to claim 1, wherein the second end portion of the last pattern in said first track is substantially perpendicular to the inner edge of the exit end portion of said crooked bar-shaped pattern.

3. A magnetic-bubble memory device according to claim 1, wherein said turn is a 90° turn.

4. A magnetic-bubble memory device according to claim 1, wherein said turn is a 180° turn.

5. A magnetic-bubble memory device according to claim 4, wherein said turn further comprises an auxiliary pattern disposed adjacent to and separated from the outer edge of said crooked bar-shaped pattern, said auxiliary pattern having an exit end portion disposed between and separated from the exit end portion of said crooked bar-shaped pattern and the first pattern in said second track.

6. A magnetic-bubble memory device according to claim 5, wherein said auxiliary pattern extends substantially parallel to said crooked bar-shaped pattern.

7. A magnetic-bubble memory device according to claim 1, wherein said bubble propagation path has a pattern period of approximately 8 $\mu$m.

8. A magnetic-bubble memory device according to claim 1, wherein said bubble propagation path has a pattern period of approximately 4 $\mu$m.

9. A magnetic-bubble memory device according to claim 1, wherein each of the hook-shaped propagation patterns has a U-shape with the first end portion fully extended and the second end portion truncated after completion of the base of the U-shape and the second end portion of each of the hook-shaped propagation patterns includes a trapezoidal extension tapering away from the base of the U-shape.

10. A magnetic-buble memory device for magnetic bubbles driven by a magnetic drive field, comprising:
    a magnetic layer in which the magnetic bubbles can be propagated; and
    a bubble propagation track in said magnetic layer, the magnetic bubbles propagating in a bubble propagation direction along said bubble propagation track in response to the magnetic drive field rotating in the plane of said magnetic layer, said bubble propagation track comprising hook-shaped patterns, each of the hook-shaped patterns having a first end portion with a first length and a tip, a mid-portion perpendicular to the first end portion, a curve connecting the mid-portion and the first end portion and a second end portion having a second length, the second length being shorter than the first length, the second end portion of a preceding hook-shaped pattern being followed in the bubble propagation direction by the first end portion of a succeeding hook-shaped pattern.

11. A magnetic-bubble memory device according to claim 10, wherein the second end portion of the preceeding hook-shaped pattern is disposed opposite the succeeding hook-shaped pattern at the curve connecting the first end portion and the mid-portion of the succeeding hook-shaped pattern.

12. A magnetic-bubble memory device according to claim 10, wherein the hook-shaped patterns are arranged in first and second bubble propagation directions and said bubble propagation track further comprises a 180° turn comprising:

a first terminal pattern having a mid-portion, a first end portion and a second end portion having a tip and a first center line, said first terminal pattern positioned in the first bubble propagation direction with the first end portion of said first terminal pattern disposed opposite and separated from the second end portion of the preceding hook-shaped pattern arranged in the first bubble propagation direction;

a main crooked bar-shaped pattern, having a first arm with a tip aligned in the first bubble propagation direction with the mid-portion of said first terminal pattern and a second arm with a second center line substantially perpendicular to the first center line and a tip aligned with the tips of the first end portion of the hook-shaped patterns arranged in the second bubble propagation direction;

an auxiliary crooked bar-shaped pattern having a first arm substantially parallel to the first arm of said main crooked bar-shaped pattern, a mid-portion substantially parallel to the second arm of the main crooked bar-shaped pattern and a second arm with a tip disposed opposite and separated from the curve of the succeeding hook-shaped pattern in the second bubble propagation direction.

13. A magnetic-bubble memory device according to claim 12, wherein the second arm of said auxiliary crooked bar-shaped pattern is perpendicular to the mid-portion of said auxiliary crooked bar-shaped pattern and the tip of the second arm of said auxiliary crooked bar-shaped pattern is aligned with the second center line.

* * * * *